United States Patent

Tsai et al.

[11] Patent Number: 5,965,464
[45] Date of Patent: Oct. 12, 1999

[54] MANUFACTURING METHOD OF DOUBLE SPACER STRUCTURE FOR MIXED-MODE IC

[75] Inventors: Meng-Jin Tsai, Hsinchu Hsien; Cheng-Han Huang; Te-Chuan Liao, both of Hsinchu; Chen-Wei Lee, Taipei, all of Taiwan

[73] Assignee: United Microelectronics Corp., Hsin-Chu, Taiwan

[21] Appl. No.: 08/989,757

[22] Filed: Dec. 12, 1997

[30] Foreign Application Priority Data

Sep. 1, 1997 [TW] Taiwan .................................. 86112503

[51] Int. Cl.$^6$ ................................................... H01L 21/302
[52] U.S. Cl. .............................................. 438/723; 438/725
[58] Field of Search ..................................... 438/696, 714, 438/230, 265

[56] References Cited

U.S. PATENT DOCUMENTS

| | | | |
|---|---|---|---|
| 4,775,642 | 10/1988 | Chang et al. | 438/258 |
| 5,091,763 | 2/1992 | Sanchez | 357/23.9 |
| 5,296,410 | 3/1994 | Yang | 438/696 |
| 5,620,919 | 4/1997 | Godinho et al. | 438/230 |
| 5,641,698 | 6/1997 | Lin | 438/305 |
| 5,683,932 | 11/1997 | Bashir et al. | 438/427 |

*Primary Examiner*—Robert Kunemund
*Assistant Examiner*—Bernadine Okaro

[57] ABSTRACT

A method for forming a double spacer structure comprising the steps of first providing a semiconductor substrate that has a first gate and a second gate already formed thereon, wherein the gate length of the second gate is greater than the gate length of the first gate. Then, a first insulating layer is formed over the substrate and the gates. Next, a photoresist layer is formed over the first insulating layer above the second gate while exposing the first insulating layer above the first gate. Subsequently, a first etching operation is performed to establish a first spacer structure along the sidewalls of the first gate, and then the photoresist layer is removed leaving the first insulating layer over the second gate. Thereafter, a second insulating layer is formed over the substrate, the first gate and the first insulating layer, and then a second etching operation is performed to establish a second spacer structure along the sidewalls of the second gate. Therefore, a second spacer that has a width greater than the first spacer does is finally obtained.

20 Claims, 2 Drawing Sheets

MANUFACTURING METHOD OF DOUBLE SPACER STRUCTURE FOR MIXED-MODE IC

BACKGROUND OF THE INVENTION

1. Field of Invention

The present invention relates to a double spacer structure for mixed-mode IC and its manufacturing method. More particularly, the present invention relates to a double spacer structure for mixed-mode IC and its manufacturing method that utilizes a two-step-etching process.

2. Description of Related Art

Conventional mixed-mode IC includes embedded dynamic random access memory (embedded DRAM), embedded static random access memory (embedded SRAM) and application specific integrated circuit (ASIC). In a mixed-mode IC, there are at least two types of transistor devices, for example, memory devices and logic devices. According to the design rules and their corresponding differences in gate is oxide dimensions a different operational voltage must be applied to the gate of each type of transistor device. For example, a device such as a memory device having a gate oxide layer thickness of about 50 Å and a gate length of about 0.25 $\mu$m, the gate operational voltage is about 2.5V; for a device such as a peripheral circuit device having a gate oxide thickness of about 70 Å and a gate length of about 0.34 $\mu$m, the gate operational voltage is about 3.3V; and for a device such as a high voltage device having a gate oxide thickness of about 120 Å and a gate length of about 0.5 $\mu$m, the gate operational voltage is about 5.0V.

In mixed-mode ICs, each transistor device has its own spacer structure whose width varies according to the design rules. The spacer is a means to provide a suitable resistance for the transistor channel. If the spacer width is too short, electric field between the source and the drain terminal of a transistor will be too strong and will lead to device reliability issues, for example, hot carrier problem or short channel problem. On the other hand, if the spacer width is too long, driving current between the source and the drain terminal will be too low. The main defect in the conventional method of spacer production is that there is no systematic process for the simultaneous production of spacers having different width to satisfy the needs of different types of transistor devices.

In light of the foregoing, there is a need in the art for improving the method of spacer formation.

SUMMARY OF THE INVENTION

Accordingly, the present invention is directed to provide a double spacer structure for mixed-mode ICs and its manufacturing method that can produce spacer having width of various sizes.

To achieve these and other advantages and in accordance with the purpose of the invention, as embodied and broadly described herein, the invention includes a method for forming a double spacer structure for mixed-mode IC comprising the steps of first providing a semiconductor substrate that has a first gate and a second gate already formed thereon, wherein the gate length of the second gate is greater than the gate length of the first gate. Then, a first insulating layer is formed over the substrate and the gates. Next, a photoresist layer is formed over the first insulating layer above the second gate while exposing the first insulating layer above the first gate. Subsequently, a first etching operation is performed to establish a first spacer structure along the sidewalls of the first gate, and then the photoresist layer is removed leaving the first insulating layer over the second gate. Thereafter, a second insulating layer is formed over the substrate, the first gate and the first insulating layer, and then a second etching operation is performed to establish a second spacer structure along the sidewalls of the second gate. Therefore, a second spacer that has a width greater than the first spacer does is finally obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
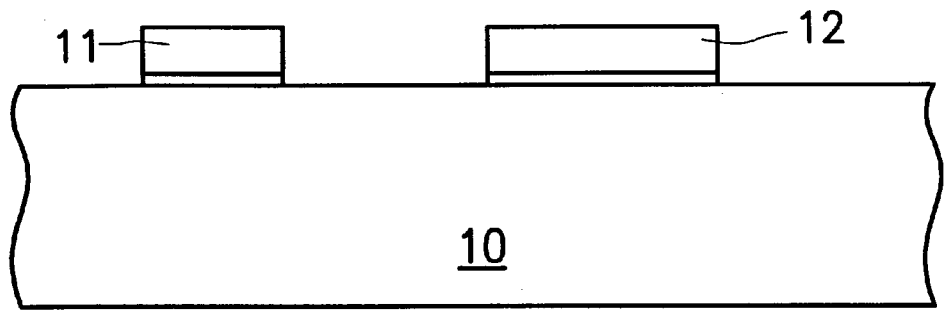
FIG. 1A through 1F are cross-sectional views showing the progression of manufacturing, steps for the production of a double spacer structure for a mixed-mode IC according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A through 1F are cross-sectional views showing the progression of manufacturing steps for the production of a double spacer structure for a mixed-mode IC according to one preferred embodiment of the invention.

First, as shown in FIG. 1A, a semiconductor substrate 10 that has at least a first gate 11 and a second gate 12 already formed thereon is provided. In FIG. 1A, width of the second gate 12 is assumed greater than the first gate 11. For example, the second gate 12 has a length of about 0.34 $\mu$m (or 0.5 $\mu$m), while the first gate 11 has a length of about 0.25 $\mu$m.

Figure 1B:
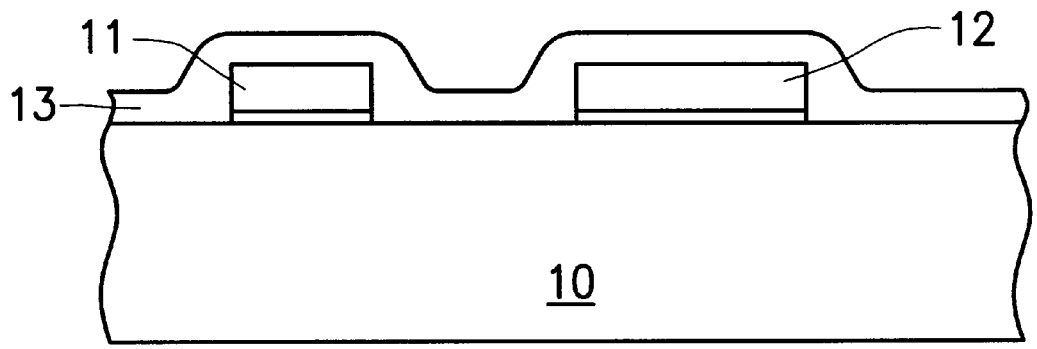

Next, as shown in FIG. 1B, a first insulating layer 13 having a thickness of between 500 Å to 3000 Å is formed over the substrate 10, the first gate 11 and the second gate 12. The first insulating layer 13 can be an oxide layer, a silicon nitride (SiN) layer, or a silicon oxynitride (SiNO) layer, for example.

Figure 1C:
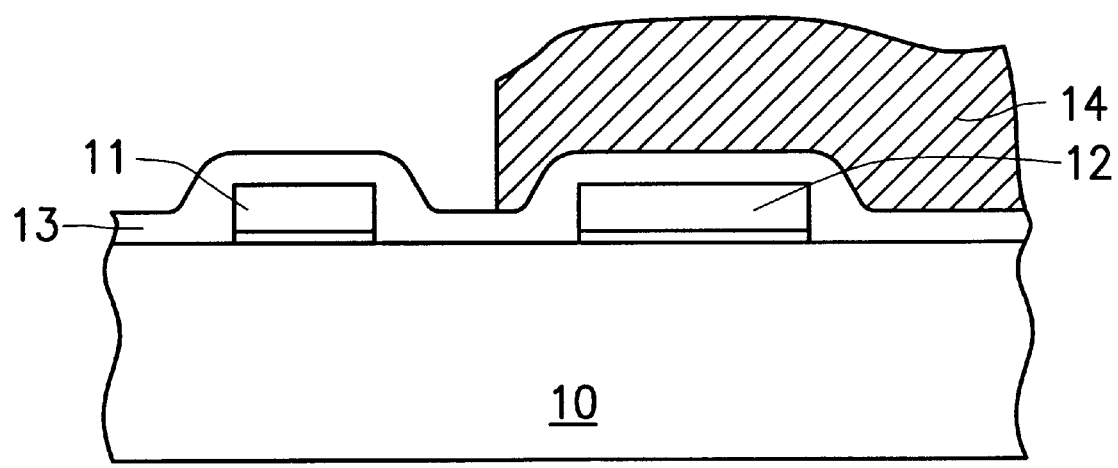

In the subsequent step, as shown in FIG. 1C, a photoresist layer 14 is formed over the first insulating layer 13 above the second gate 12 for protecting the first insulating layer 13 against subsequent etching operation.

Figure 1D:
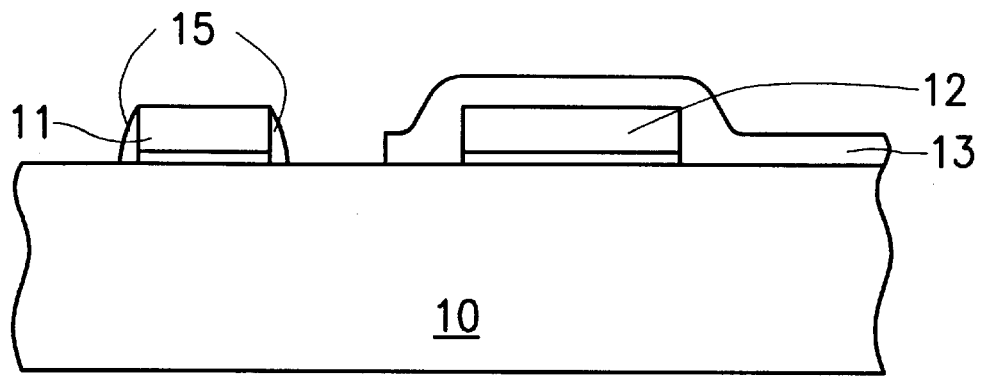

Next, as shown in FIG. 1D, a first etching operation is performed to etch the exposed first insulating layer 13 into a first spacer structure 15 along the sidewalls of the first gate 11. The desired spacer width of the above etching operation can be obtained by controlling the etching recipe contents. For example, the correct spacer width can be obtained by varying the radio frequency power supplied, the length of over-etching time, the gas flow rate of reactants, or the chamber pressure in the reaction chamber during the etching operation. Subsequently, the photoresist layer 14 is removed.

Figure 1E:
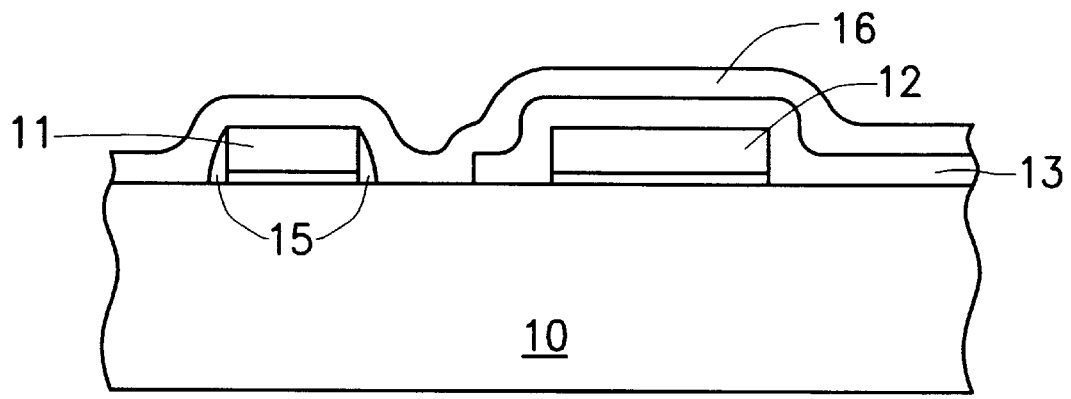

Thereafter, as shown in FIG. 1E, a second insulating layer 16 that has a thickness of between 500 Å to 3000 Å is deposited over the substrate 10, the first gate 11 and the first insulating layer 13. The second insulating layer 16 can be an oxide layer, a silicon nitride layer or a silicon oxynitride layer, for example.

Figure 1F:
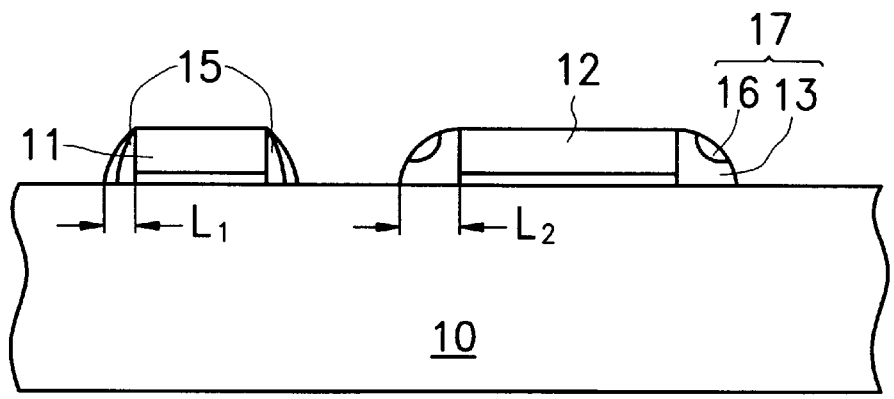

Finally, as shown in FIG. 1F, a second etching operation is performed to etch the second insulating layer 16 and the first insulating layer 13 into a second spacer structure 17 along the sidewalls of the second gate 12. Because portions of the second insulating layer 16 remains on the sidewalls of the second gate 12 after the second etching operation, width $L_2$ of the second spacer 17 will be greater than the width $L_1$ of the first spacer 15. For example, the length of the second spacer is preferably in the range between 0.1 μm to 0.4 μm, while the length of the first spacer is preferably in the range between 0.04 μm to 0.2 μm. Again, the desired spacer width of the above etching operation can be obtained by controlling the etching recipe contents. For example, the correct spacer width can be obtained by varying the radio frequency power supplied, the length of over-etching time, the gas flow rate of reactants, or the chamber pressure in the reaction chamber during the etching operation. This completes the production of different spacer widths for different device structures according to the invention.

As a summary, the double spacer structure of a mixed-mode IC and its manufacturing method according to the present invention has the following characteristics:

(1) The two-step-etching scheme of this invention provides a method for forming gate spacers having appropriate widths for different gate devices, and is therefore advantageous to the future development of miniaturized devices.

(2) In the present invention, spacer width can be adjusted by controlling the etching recipe contents. For example, the correct spacer width can be obtained by varying the radio frequency power supplied, the length of over-etching time, the gas flow rate of reactants, or the chamber pressure in the reaction chamber during the etching operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a double spacer structure for mixed mode IC, comprising the steps of:

(a) providing a semiconductor substrate having at least a first gate and a second gate, and further that the length of the second gate is larger than the length of the first gate;

(b) forming a first insulating layer above the substrate, the first gate and the second gate;

(c) forming a photoresist layer over the first insulation layer above the second gate while exposing the first insulation layer above the first gate;

(d) performing a first etching operation to etch the first insulation layer into a first layer of a first spacer along the sidewalls of the first gate, thereafter removing the photoresist layer leaving portions of the first insulation above the second gate;

(e) forming a second insulation layer over the substrate, the first gate and the first insulation layer; and (f) performing a second etching operation to etch the first insulation layer and the second insulation layer into a second spacer along the sidewalls of the second gate, and to form a second layer of the first spacer, wherein the width of the second spacer is greater than the width of the first spacer.

2. The method of claim 1, wherein the first insulating layer has a thickness in the range between 500 Å to 3000 Å.

3. The method of claim 1, wherein the step of forming the first insulating layer includes depositing oxide.

4. The method of claim 1, wherein the step of forming the first insulating layer includes depositing silicon nitride.

5. The method of claim 1, wherein the step of forming the first insulating layer includes depositing silicon oxynitride.

6. The method of claim 1 wherein the second insulating layer has a thickness in the range between 500 Å to 3000 Å.

7. The method of claim 1, wherein the step of forming the second insulating layer includes depositing oxide.

8. The method of claim 1 wherein the step of forming the second insulating layer includes depositing silicon nitride.

9. The method of claim 1 wherein the step of forming the second insulating layer includes depositing silicon oxynitride.

10. The method of claim 1, wherein in step (d), the method of obtaining the width of the first spacer includes controlling the etching recipe contents.

11. The method of claim 1, wherein in step (d), the method of obtaining the width of the first spacer includes controlling the level of the radio frequency power supplied during etching.

12. The method of claim 1, wherein in step (d), the method of obtaining the width of the first spacer includes controlling the length of over-etching time.

13. The method of claim 1, wherein in step (d), the method of obtaining the width of the first spacer includes controlling the gas flow rate of the reactants during etching.

14. The method of claim 1, wherein in step (d), the method of obtaining the width of the first spacer includes controlling the gas pressure in the reaction chamber during etching.

15. The method of claim 1, wherein in step (f), the method of obtaining the width of the first spacer includes controlling the etching recipe contents.

16. The method of claim 1, wherein in step (f), the method of obtaining the width of the first spacer includes controlling the level of the radio frequency power supplied during etching.

17. The method of claim 1, wherein in step (f), the method of obtaining the width of the first spacer includes controlling the length of over-etching time.

18. The method of claim 1, wherein in step (f), the method of obtaining the width of the first spacer includes controlling the gas flow rate of the reactants during etching.

19. The method of claim 1, wherein in step (f), the method of obtaining the width of the first spacer includes controlling the gas pressure in the reaction chamber during etching.

20. The method of claim 1, wherein the second layer of the first spacer is substantially removed in step (f).

* * * * *